United States Patent [19]
Goodman et al.

[11] Patent Number: 5,519,176
[45] Date of Patent: May 21, 1996

[54] SUBSTRATE AND CERAMIC PACKAGE

[75] Inventors: Thomas W. Goodman, Kanagawa; Hiroyuki Fujita, Tokyo; Yoshikazu Murakami, Kanagawa; Arthur T. Murphy, Tokyo, all of Japan; Daniel I. Amey, Hockessin, Del.

[73] Assignee: Sony Corporation, Tokyo, Japan

[21] Appl. No.: 223,240

[22] Filed: Apr. 5, 1994

[30] Foreign Application Priority Data

Apr. 5, 1993 [JP] Japan ..................... 5-100101

[51] Int. Cl.$^6$ .................................................. H05K 1/14
[52] U.S. Cl. ........................ 174/255; 174/250; 361/748; 361/794
[58] Field of Search ..................... 174/250, 255; 361/794, 799, 753, 748

[56] References Cited

U.S. PATENT DOCUMENTS

| | | | |
|---|---|---|---|
| 5,028,473 | 7/1991 | Vitriol et al. | 428/137 |
| 5,231,751 | 8/1993 | Sachdev et al. | 29/852 |
| 5,329,695 | 7/1994 | Traskos et al. | 29/830 |
| 5,348,792 | 9/1994 | Hattori et al. | 428/209 |

Primary Examiner—Laura Thomas
Attorney, Agent, or Firm—Hill, Steadman & Simpson

[57] ABSTRACT

A substrate or a ceramic package for packaging semiconductor chips, which comprises an insulating layer having a signal line on one surface of said insulating layer and a power line or ground line corresponding to said signal line on the other surface of said insulating layer. A well-controlled constant high frequency characteristics, and particularly, characteristic impedance, can be obtained on the signal line without being influenced by the power line or ground line.

13 Claims, 9 Drawing Sheets

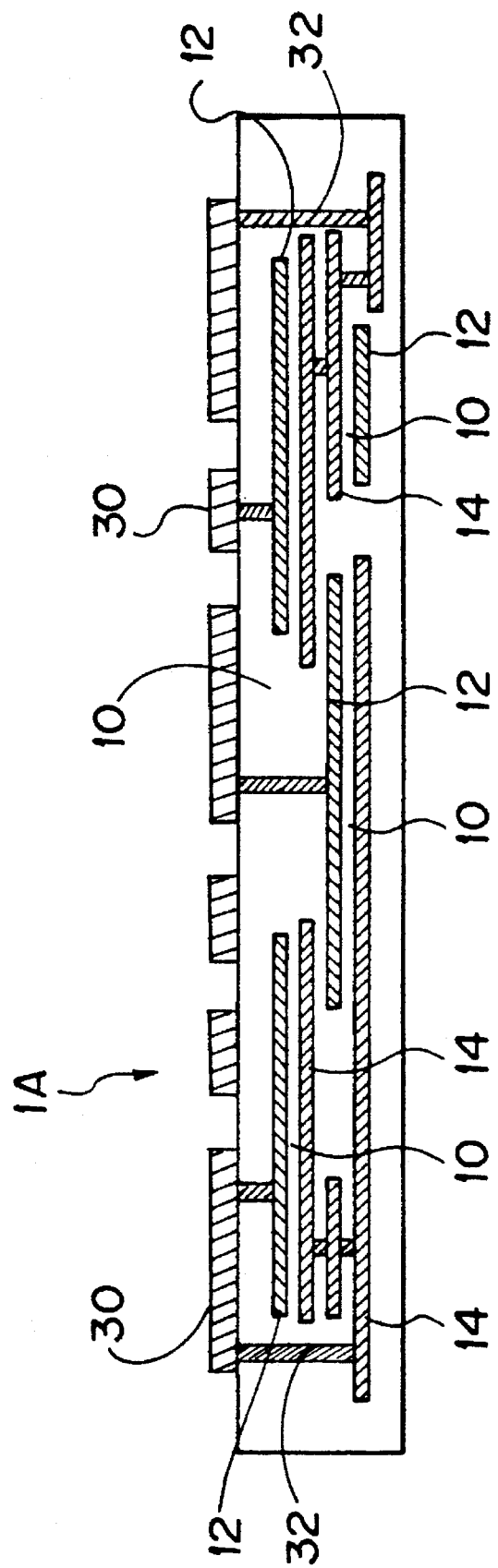

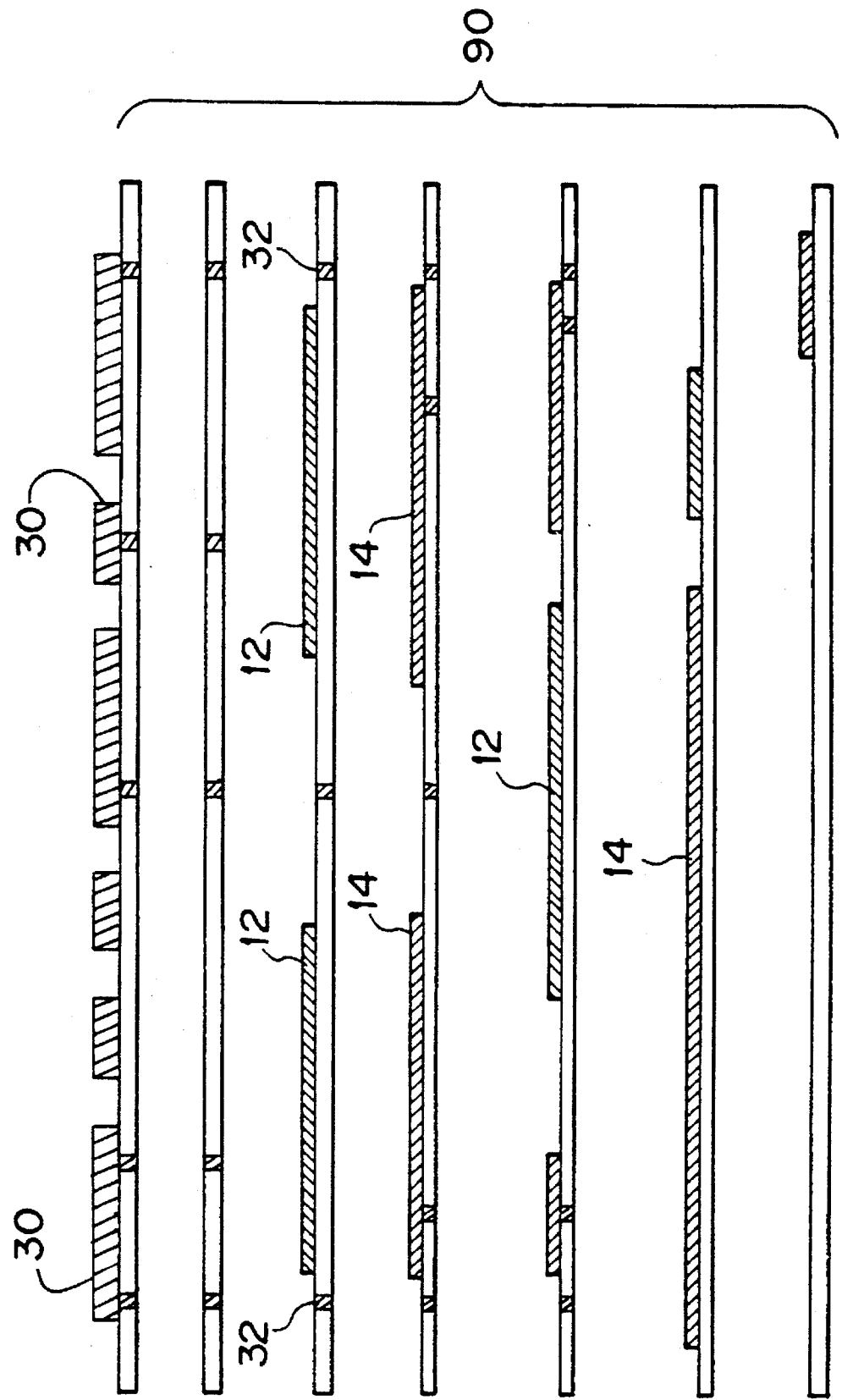

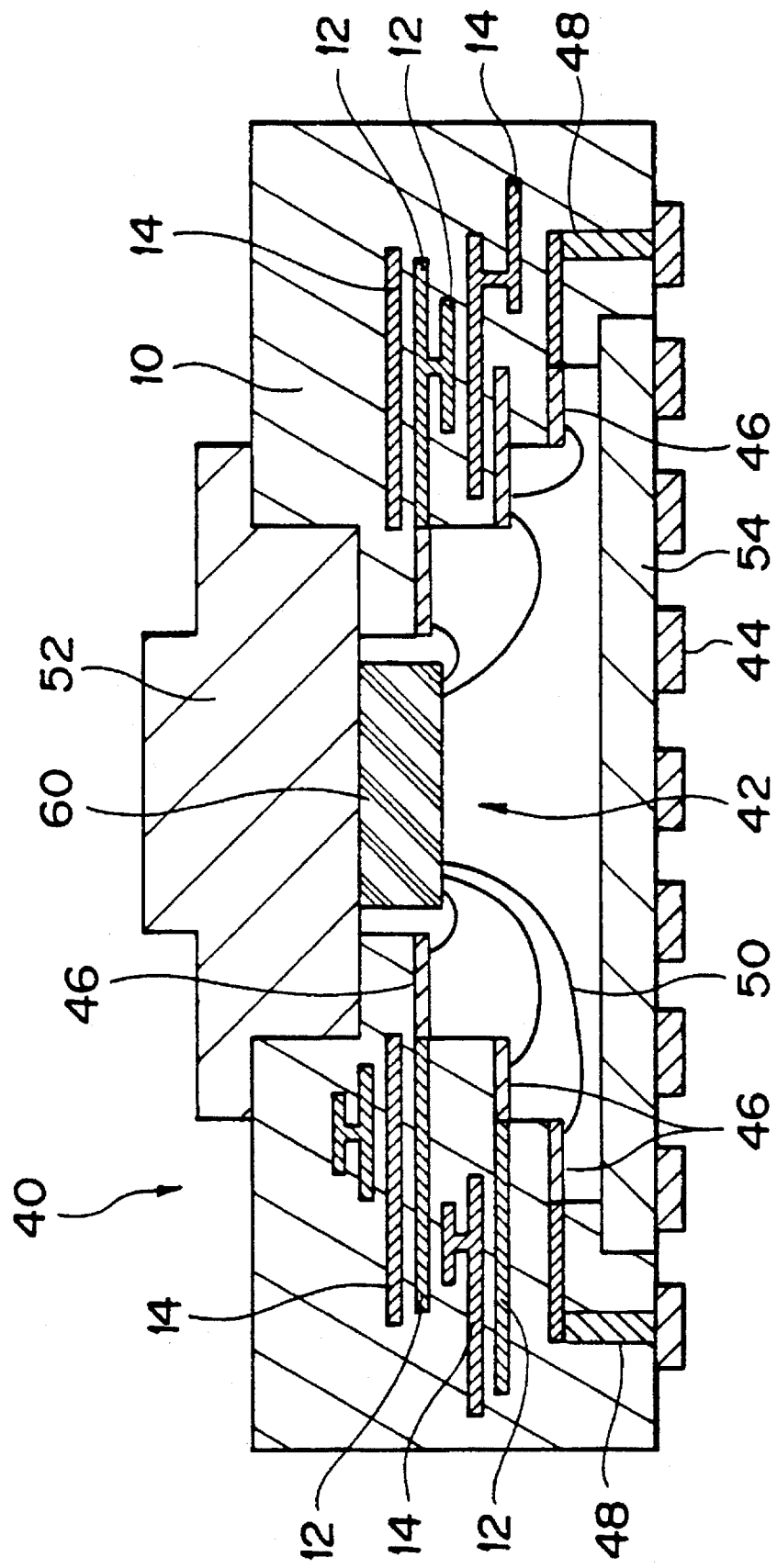

1

SUBSTRATE AND CERAMIC PACKAGE

BACKGROUND OF THE INVENTION

1. Field of the Invention

The present invention relates to a substrate having a power line or ground line, and to a ceramic package having the same.

2. Description of the Prior Art

With increasing demand for more compact and higher performance electronic devices, the high density mounting or packaging of active and passive elements and the like is being recognized as the key problem to be solved. To cope with the problems that are encountered in mounting or packaging the elements at a still higher density, there is a tendency of using multilayered substrates for mounting thereon the active and passive elements, or of employing multilayered packages for packaging semiconductor chips. The multilayered substrates include a multilayered printed wiring board and various types of multilayered wiring substrates specially used for mounting hybrid ICs and multi chip modules. Examples of the packages for packaging semiconductor chips, which are composed of a plurality of laminated low-temperature cofired ceramic sheets, include a Pin Grid Array (hereinafter abbreviated as "PGA") package, a Land Grid Array (LGA) package, and a Quad Flat Package (QFP). Any of the multilayered printed wiring boards and the multilayered wiring substrates enumerated above is referred to hereinafter simply by the generic term "substrate", and any of the packages above is sometimes referred to hereinafter simply by the generic term "ceramic package".

In general, a ceramic multilayered wiring substrate or a ceramic package comprises, as shown in FIGS. 1A–C, an insulating layer 100 having a signal line 102 on one side thereof, and a power line or ground line 104 on the other side thereof. Another insulating layer 100A located under the power line or ground line 104 is also shown in the figure. Though not shown in the figure, another insulator layer is provided on the upper side of the signal line 102.

A schematically drawn partial plane view showing the relation between the signal line 102 and the power line or ground line 104 is given in FIG. 1 (A). The insulating layers 100 and 100A, however, are excluded from the figure. FIG. 1 (B) is a schematically drawn partial cross section view along the line B—B, and FIG. 1 (C) is a schematic view of the power line or ground line 104 patterned into a mesh. The region defined inside the squares in FIG. 1 (C) has no power lines or ground lines formed therein.

An LGA package comprising a plurality of laminated low-temperature cofired ceramic sheets can be fabricated, for instance, by a process comprising: processing a green sheet containing borosilicate glass and the like as the principal component into a sheet of a predetermined size; perforating the sheet by punching and the like to provide holes for use as through holes or via holes; burying the thus perforated holes in the green sheet with a metallic paste containing gold, silver, copper, etc., as the principal component; screen printing the metallic paste on the green sheet to provide signal lines 102 and power lines or ground lines 104 on the surfaces of the green sheet; and forming, for example, through holes or via holes for electrically connecting the signal lines 102 and the power lines or ground lines 104, land portions as a connecting portion with the external circuits, and connection terminals for the semiconductor chips (such as wire bonding portions). Then, a predetermined number of such green sheets are fabricated, laminated, and sintered simultaneously in a temperature range of from about 800° to 1,000° C. Thus is obtained a complete LGA package comprising low temperature cofired ceramic sheets, having a signal line 102 on one side of the insulating layer and a power line or ground line 104 on the other side of each of the laminated ceramic sheets.

In the process described above, gas evolves during the sintering or the cofiring. If the power line or ground line should be formed over the entire surface of the low temperature cofired ceramic sheet instead of providing it in a meshed pattern, the gas evolved from the green sheet would remain undissipated. The gas thus evolved would then be trapped between the green sheets to cause inter-layer separation. Furthermore, the evolution of gas during cofiring impairs the dimensional stability of the green sheet. Thus, in case of using a green sheet which evolves gas, in general, the power line or ground line is formed into a meshed pattern.

A multilayered printed circuit board can be fabricated, for instance, by etching a first copper foil of a copper-clad glass epoxy laminate or a flexible copper-clad polyimide laminate (hereinafter collectively referred to simply as "the copper-clad laminate") to form a power line or ground line on the first copper-clad laminate to give the inner layer, laminating this inner copper-clad laminate with a second copper-clad laminate for the outer layer using a hot press, and copper plating and etching the second copper-clad laminate provided as the outer layer to form a circuit inclusive of the signal line and the like.

Also in multilayered printed circuit boards, there are cases of forming a mesh-patterned power line or ground line on the copper-clad laminate for the inner layer to prevent warping or twisting from occurring on a substrate, e.g., a copper-clad laminate, and to improve the dimensional stability of the substrate.

A certain type of multilayered wiring substrate for use in hybrid ICs and multi chip modules comprises a base made of silicon or ceramics, formed thereon a plurality of signal lines and power lines or ground lines insulated by a polyimide resin insulator layer. Bare chips, for example, are mounted on these types multilayered wiring substrates.

In these types of multilayered wiring substrates for hybrid ICs and multi chip modules, the power lines or ground lines are sometimes formed in mesh patterns. In this manner, the gas generated from polyimide during thermosetting the polyimide resin can be discharged to prevent inter layer separation from occurring, and the dimensional stability of the substrate can be improved.

Referring to FIGS. 1A–C again, when a mesh-patterned power line or ground line 104 is formed, the power line or ground line 104 not always is found under the signal line 102 (see FIG. 1 (B)). More specifically, the signal line 102 may or may not run over the power line or ground line 104. The high frequency characteristics, the characteristic impedance in particular, changes depending on the presence of the power line or ground line 104. This causes a problem of impedance discontinuity in the transmission line.

Accordingly, an object of the present invention is to provide a substrate and a ceramic package having a power line or ground line which less influences the high frequency characteristics of the signal line.

SUMMARY OF THE INVENTION

The aforementioned object of the present invention can be accomplished, in one aspect, by a substrate comprising an insulating layer, having a signal line on one of the surfaces of said insulating layer and a power line or ground line corresponding to the signal line on the other surface thereof.

The aforementioned object of the present invention can be accomplished, in another aspect, by a ceramic package comprising a semiconductor chip packaged therein, which comprises an insulator layer composed of a low temperature cofired ceramic sheet having a signal line formed on one of the surfaces of the insulating layer and a power line or ground line corresponding to the signal line on the other surface thereof.

The term "having a power line or ground line corresponding to the signal line" signifies that the power line or ground line is formed in such a manner that the image of the signal line projected to the insulator layer roughly matches to the shape of the power line or ground line formed on the other side of the insulator layer, or that said projected image of the signal line is included ill the area of the power line or ground line.

The substrate of the ceramic package according to the present invention preferably comprises, on the surface of the insulator layer having the power line or ground line thereon but at portions where no power line or ground line is formed, a mesh-like conductor connected to the power line or ground line. The signal line as well as the power line or ground line, or the mesh-like conductor are formed, for example, by printing a metallic paste and then firing the printed metallic paste, or by etching a metallic foil such as a copper foil. Usable as the metallic pastes are those containing gold, silver, copper, or nickel as the principal component thereof.

The insulator layer of the substrate according to the present invention preferably comprises a laminate of a plurality of low temperature cofired ceramic sheets, or a laminate of a plurality of polymer material layers. In case of a substrate comprising a laminate of a plurality of low temperature cofired ceramic sheets, the insulating layer can be formed simultaneously with the ceramic sheets at the low temperature cofiring of the plurality of ceramic green sheets provided for the low temperature cofiring. In case of a substrate made of a laminate of a plurality of polymer material layers, the insulating layer can be provided by using a polymer such as a polyimide resin, a modified polyimide resin, an epoxy resin, an imide-modified epoxy resin, a bismaleimide-triazine resin, an aralkyl ether resin, a polyvinylphenol resin, a fluororesin, and a poly(phenylene oxide) (PPO) resin, or a reinforcing material such as a glass fiber cloth or a glass non-woven impregnated with the polymer materials enumerated above, or a polyimide film.

The term "low temperature cofired ceramic sheet" as referred herein signifies a ceramic sheet obtained by the so-called low temperature cofiring of ceramic green sheets commonly used in low temperature cofiring.

The materials for use as the ceramic sheet of low temperature cofiring include, though not only limited thereto, a composite of a glass ceramic material such as a combination of a borosilicate glass with alumina, a combination of a lead borosilicate glass with alumina, a combination of a calcia-alumina-borosilicate glass with alumina, a combination of a magnesia-alumina-borosilicate glass with quartz or quartz glass, a combination of a borosilicate glass with alumina and forsterite, and a combination of a borosilicate glass with quartz, alumina, and cordierite; a material based on a crystallized glass such as a cordierite-β-spodumene system material, a cordierite-$ZnO.MgO.Al_2O_3.SiO_2$ system material, and a cordierite-$B_2O_3. MgO.Al_2O_3. SiO_2$ system material; and a crystalline material such as $Al_2O_3.CaO.SiO_2.MgO.B_2O_3$ system material and $Al_2O_3.CaO.SiO_2.BaO.B_2O_3$ system material. Any material sinterable at a temperature lower than the melting point of a metal constituting the metallic paste (for example, gold, copper, silver, and nickel, each having a melting point of 1,065° C., 1,085° C., 962° C., and 1,455° C., respectively) can be used as well. Thus, any material sinterable at a temperature of, for example, from 800° to 1,000° C. can be used in the present invention.

In the substrate or the package according to the present invention, the insulating layer comprises a power line or ground line corresponding to the signal line. Referring to FIGS. 2A–C, though only the lower side of the insulating layer is shown therein, a power line or ground line 14 can be always found on the upper or the lower side of an insulating layer having provided a signal line 10 on one of the surfaces thereof, in such a manner that the power line or ground line 14 is placed on the other surface of the insulating layer 10 opposing to the surface having the signal line 12. In other words, the signal line 12 always runs either the upper or the lower side of the power line or ground line 14. Thus, the high frequency characteristics, particularly the characteristic impedance, of the signal line can be controlled constant without being influenced by the presence of a power line or ground line. The problems of the prior art technology, i.e., the fluctuation in high frequency characteristics of the signal line depending on the power line or ground line, can be overcome in this manner. Referring to FIGS. 2A–C, another insulating layer 10A is present at the lower portion of the power line or ground line 14. In some cases, an insulating layer is present over the signal line 12.

FIG. 2 (A) shows a schematically drawn partial plane view of the relation between the signal line 12 and the power line or ground line 14. The insulating layers 10 and 10A are omitted from the figure. FIG. 2 (B) shows a schematically drawn partial cross section along line B—B, and FIG. 2 (C) schematically shows the pattern of the power line or ground line 14. Referring to FIG. 2 (C), the region characteristic to the present invention, i.e., the power line or ground line provided corresponding to the signal line, is indicated with broken lines. The region 14B defined inside a square or a polygon in FIG. 2 (C) corresponds to the region having no power line or ground line. FIGS. 2A–C show the preferred mode of the present invention, in which a mesh-shaped conductor 14C is formed.

BRIEF DESCRIPTION OF THE DRAWINGS

FIG. 3 is a schematic cross section view of a substrate according to an embodiment of the present invention (Example 1);

FIG. 5 shows the schematic cross section of various types of ceramic green sheet before laminating, for use in the fabrication of a substrate according to an embodiment of the present invention (Example 1);

FIG. 9 is a schematic cross section view of a ceramic package according to an embodiment of the present invention (Example 3), in which a semiconductor chip is enclosed.

DETAILED DESCRIPTION OF THE PREFERRED EMBODIMENTS

The present invention is illustrated in greater detail referring to non-limiting examples below with the attached figures. It should be understood, however, that the present invention is not to be construed as being limited thereto.

EXAMPLE 1

Referring to the schematic cross section view of FIG. 3, the present example which relates to a substrate according to an embodiment of the present invention is described below. A substrate 1A is a low temperature cofired ceramic substrate, which comprises an insulating layer 10 composed of a plurality of low temperature cofired ceramic sheets, a signal line 12, and a power line or ground line 14.

The insulating layer 10 has a signal line 12 on one surface thereof, and a power line or ground line 14 on the other. In the present example, the power line or ground line 14 was provided at approximately the same pattern as that of the signal line 12, and the width of the power line or ground line 14 was set exactly the same as that of the signal line 12.

The upper surface of the substrate 1A comprises a land portion and other circuits 30 for mounting thereon active or passive elements and the like. Via holes and other indispensable circuits 32 are provided inside the substrate 1A to use in the connection of the signal line 12, the power line and ground line 14, and the land portion and other circuits 30. If necessary, a resistor portion or a capacitor portion, though not shown in the figure, is formed inside or on the upper surface of the substrate 1A.

Figure 4A:
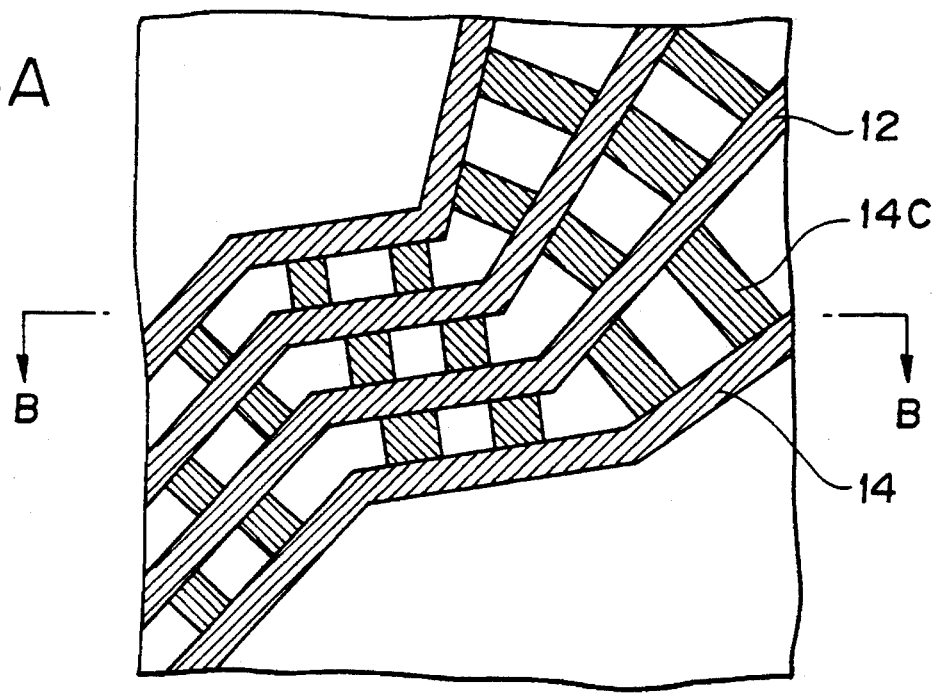
FIGS. 4A, 4B and 4C is an explanatory figure showing the positional relation between the signal line and the power line or ground line of a substrate according to an embodiment of the present invention (Example 1)
Figure 4B:
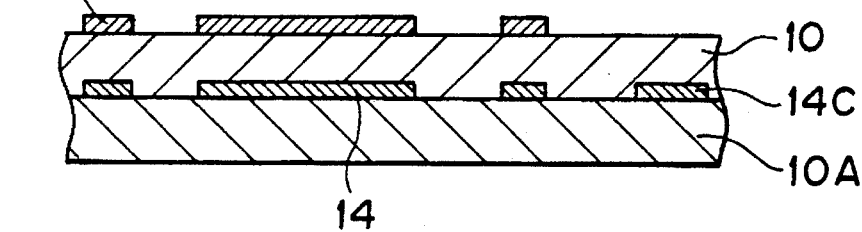
Figure 4C:
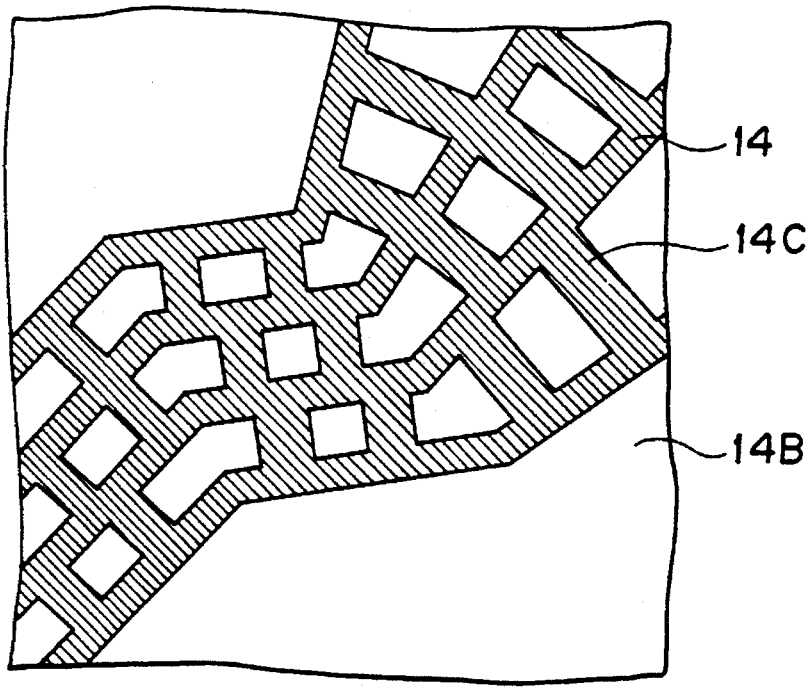

FIGS. 4A–C show the positional relation among the signal line 12, the power line or ground line 14, and the insulating layer 10. FIG. 4 (A) is a schematically drawn partial cross section view showing the relation of the signal line 12 and the power line or ground line 14, but the insulating layer 10 is omitted from the figure. FIG. 4 (B) is a schematic partial cross section along line B—B, and FIG. 4 (C) shows schematically the pattern of the power line or ground line 14. The region 14B has no power line or ground line 14 formed therein. A conductor 14C is formed in a part of the region 14B to connect the power lines or ground lines 14 with each other. In the figure, the portions corresponding to the signal line 12, the power line or ground line 14, and the conductor 14C are hatched to make them easily discernible. In practice, an insulating layer is also present on the signal line 12, but is not shown in the figure.

Figure 1A:
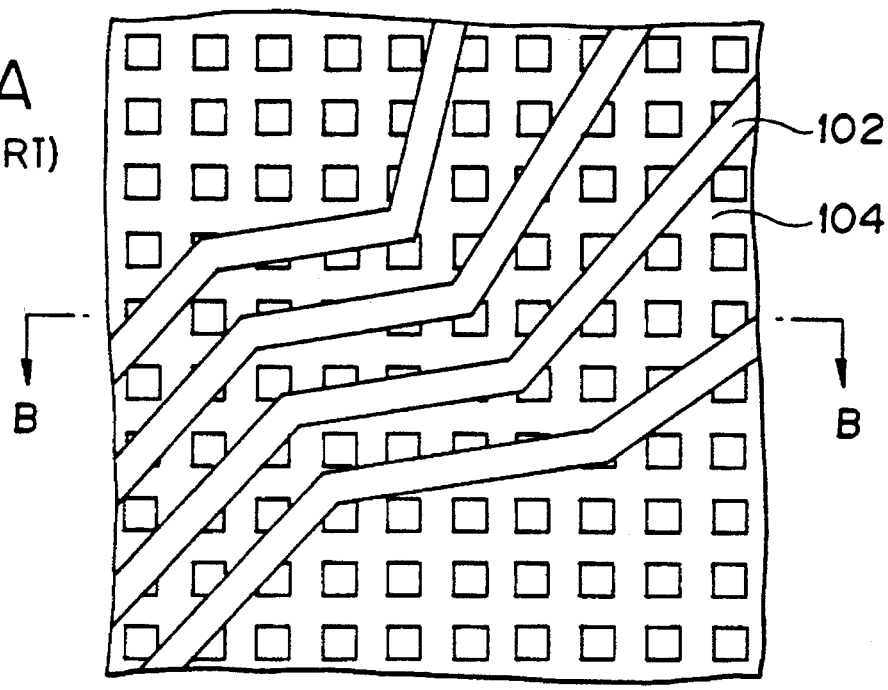
FIGS. 1A, 1B and 1C is a schematically shown multilayered wiring substrate or ceramic package according to a prior art technology.
Figure 1B:
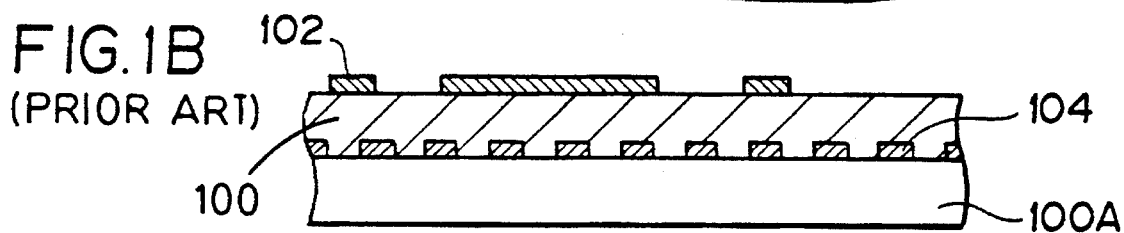
Figure 1C:
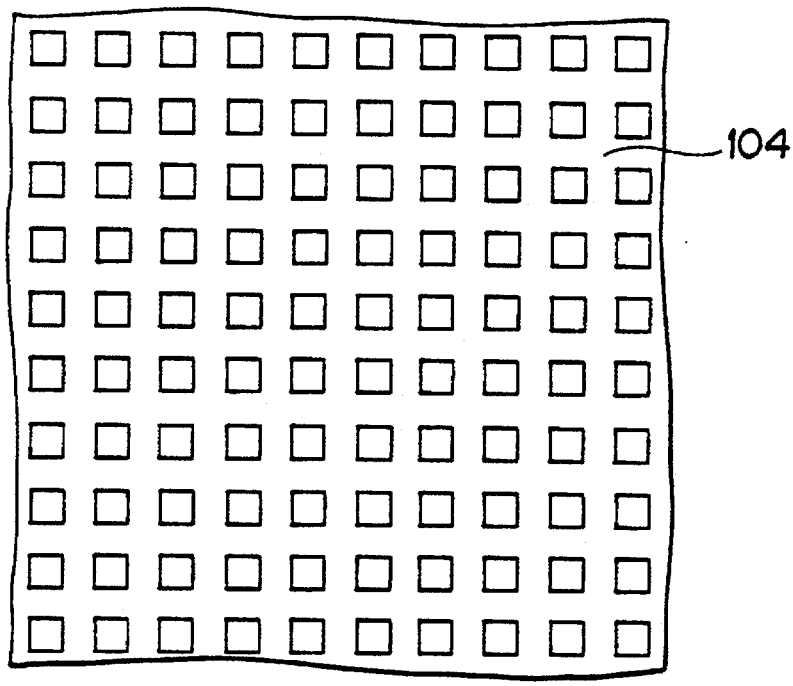
Figure 2A:
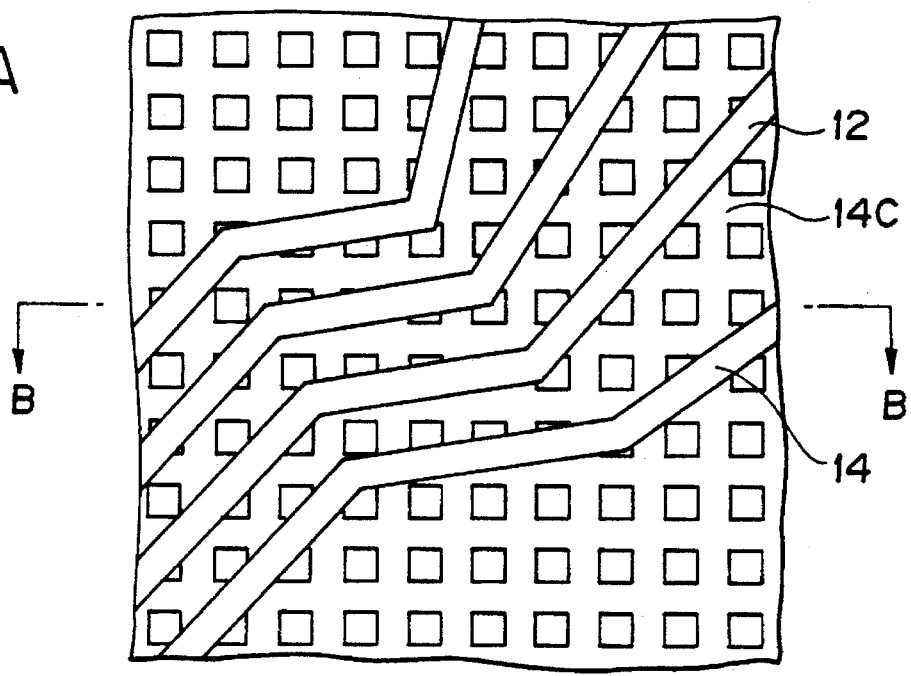
FIGS. 2A, 2B and 2C is a schematically shown multilayered wiring substrate or ceramic package according to the present invention, provided as an explanatory means to show the principle of the present invention.
Figure 2B:
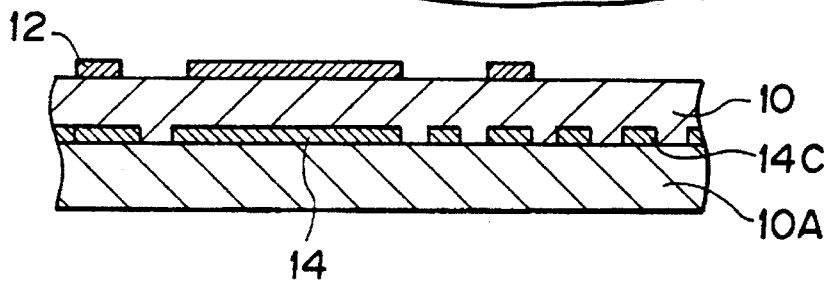
Figure 2C:
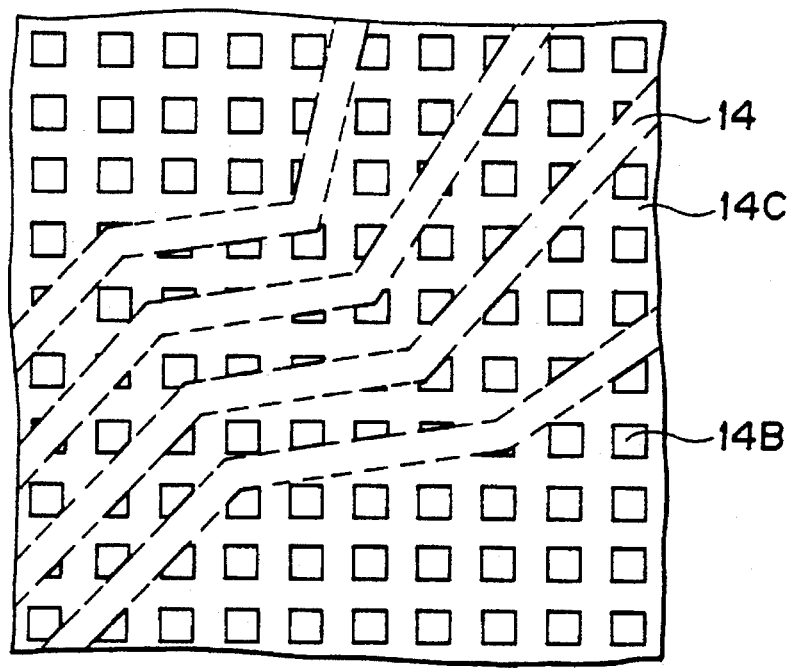

The substrate 10A shown in FIGS. 2A–C according to the present example can be fabricated, for example, by a process described below.

A commercially available ceramic green sheet "Green Tape 851TA" produced by Du Pont de Nemours & Co. having a thickness of 114 μm was used as the ceramic green sheet for low temperature cofiring. The ceramic green sheet contains 55% by weight of a borosilicate glass, 30% by weight of alumina, 7% by weight of silica, and 8% by weight of an acrylic resin.

[Step 100]

The ceramic green sheet 90 for low temperature cofiring was subjected to punching for shaping the sheet, and to perforation by means of punching, thereby providing holes which are used as the via holes and through holes.

[Step 110]

A signal line 12, a power line or ground line 14, circuits 30 and 32, and a conductor 14C were each formed on the resulting green sheet 90 by using a metal paste. In further detail, this step is composed of substeps 110A and 110B described below.

[Substep 110A]

The holes were buried with the metal paste, and the metal paste was dried to remove the solvent therefrom. Usable metal pastes include those having a low resistivity, such as a gold paste, a silver paste, and a copper paste. More specifically, for example, a paste comprising 95% by weight of a gold powder and 5% by weight of an ethyl cellulose resin as the solid components can be used. Thus was formed a part of the circuit 32 inside the hole.

[Substep 110B]

Then, each of the signal lines 12, the power lines or ground lines 14, the circuit 30, a part of the circuit 32, and the conductor 14C, were formed by screen printing using the metal paste. Usable as the metal paste is, for example, such containing 80% by weight of a gold powder, 2% by weight of an oxide, and 18% by weight of an ethyl cellulose resin as the solid components. The metal paste used in the present substep slightly differs from that used for burying the holes.

Otherwise, a part of the circuit 14 can be formed using a metal paste containing, 60% by weight of a silver powder, 10% by weight of palladium, 10% by weight of an oxide and a glass, and 20% by weight of a phenolic resin.

In this manner, a ceramic green sheet 90 can be formed in various types as shown in FIG. 5. The [Substep 110A] and the [Substep 110B] need not be in this order, and the order of the substeps can be reversed or changed depending on the individual case. Furthermore, the metal pastes in the [Substep 110A] and the [Substep 110B] are given by way of example, and can be modified as desired.

If necessary, a resistor portion or a capacitor portion, though not shown in the figure, can be formed inside or on the upper surface of the substrate 1A. A resistor portion can be formed by using, for example, a resistor material containing 45% by weight of ruthenium oxide, 8% by weight of a silver binder, 5% by weight of palladium, 20% by weight of glass, and 22% by weight of an ethyl cellulose resin. Otherwise, a material containing 40% by weight of ruthenium oxide, 5% by weight of pyrochlore, 30% by weight of glass, and 25% by weight of an ethyl cellulose resin can be used.

The resistor portion can be formed by means of, for example, screen printing, using any of the resistor materials above. Usable as the material for forming a capacitor is a tape material containing 83% by weight of barium titanate, 10% by weight of glass, and 7% by weight of an acrylic resin as the solid components. The capacitor portion can be formed by adhering the tape material above on the ceramic green sheet.

[Step 120]

A plurality of ceramic green sheets each fabricated in accordance with the [Substep 110A] and [Substep 110B] were laminated, and the resulting laminate was subjected to hot pressing using a hot press to adhere the sheets with each other and to obtain an integrated body therefrom. The laminate of the ceramic green sheets thus obtained and the metal paste (optionally together with the resistor material or the capacitor material) were then subjected to low temperature cofiring to obtain the substrate 1A. The temperature of cofiring depends on the material used. However, it is generally in the range of from 800° to 1,000° C. The conditions for the cofiring in each of the processes, such as the atmospheric control and the duration of cofiring, can be optimized in accordance with the material used in each of the cases. A single insulating layer comprising a low temperature cofired ceramic sheet has a signal line 12 on one surface and a power line or ground line on the other. The boundaries between the low temperature cofired ceramic sheets are omitted in FIG. 3.

EXAMPLE 2

Figure 6:
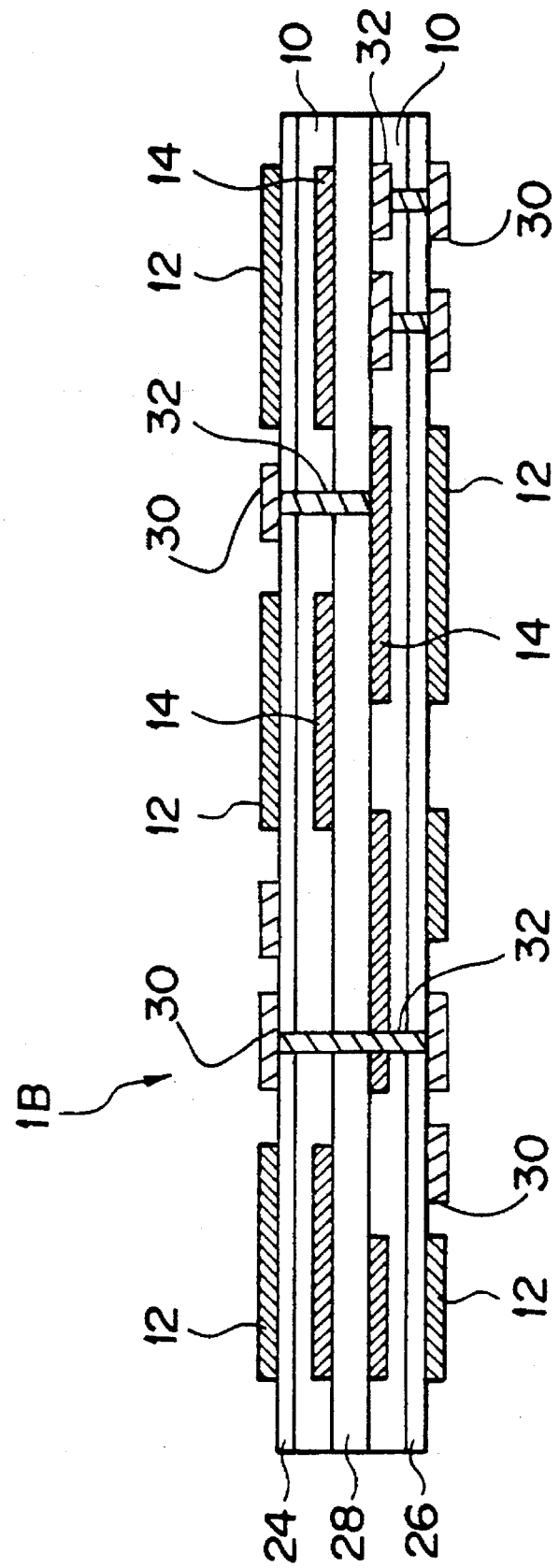
FIG. 6 is a schematic cross section view of another substrate according to another embodiment of the present invention (Example 2)

Referring to the schematic cross section view of FIG. 6, the present example which relates to a substrate according to another embodiment of the present invention is described below. A substrate 1B is a multilayered wiring substrate, and more specifically, it comprises a multilayered printed circuit board. The substrate 1B comprises a signal line 12 and a power line or ground line 14 formed from copper-clad glass epoxy laminates 24, 26, and 28, and an insulating layer 10 formed from a prepreg. The signal line 12 and the power line or ground line 14 are each formed on each of the both surfaces of the insulating layer 10. In the present example, the power line or ground line 14 is provided at a width twice as large as that of the signal line 12. The signal line 12 and the power line or the ground line 14 can be formed by etching the copper foil.

The surface of the substrate 1B having thereon the signal line also comprises a land portion and other circuits 30 for mounting active and passive elements and the like thereon. Furthermore, via holes or through holes and the like, or an inner layer circuit 32 are formed inside the substrate 1B to connect the signal line 12, the circuit 39, and the power line or ground line 14.

Figure 7A:
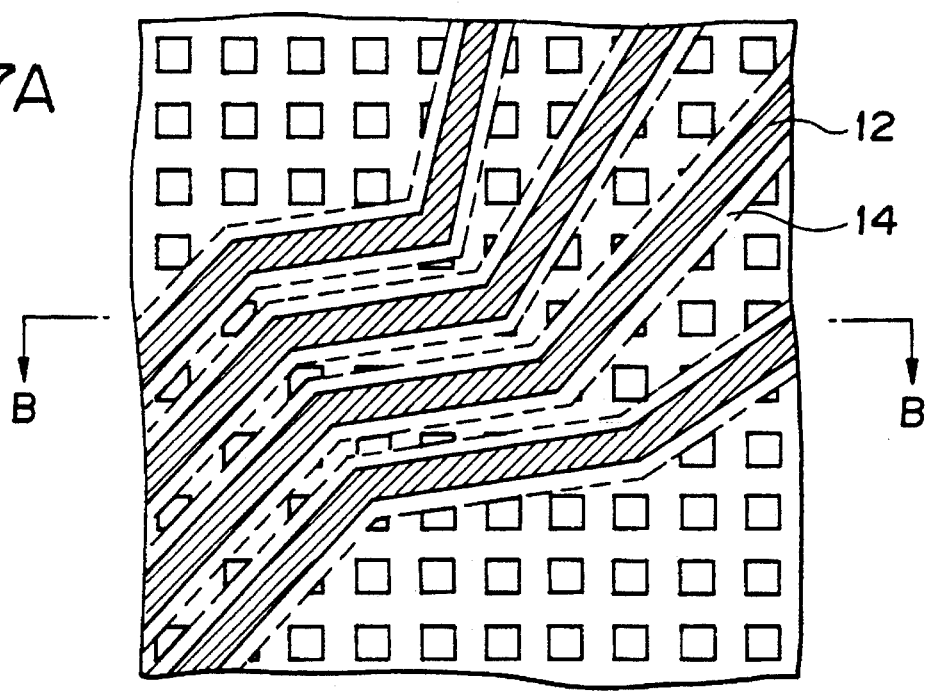
FIGS. 7A, 7B, and 7C is an explanatory figure showing the positional relation between the signal line and the power line or ground line of a substrate according to another embodiment of the present invention (Example 2)
Figure 7B:
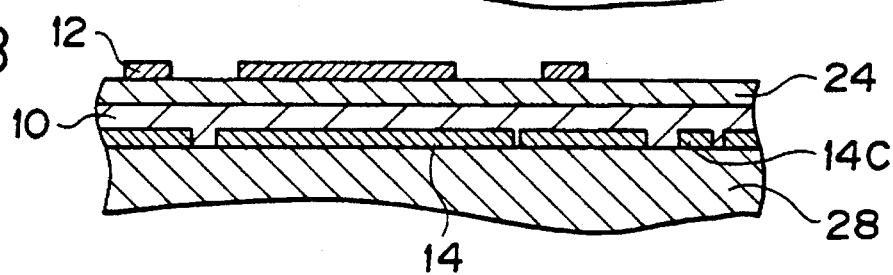
Figure 7C:
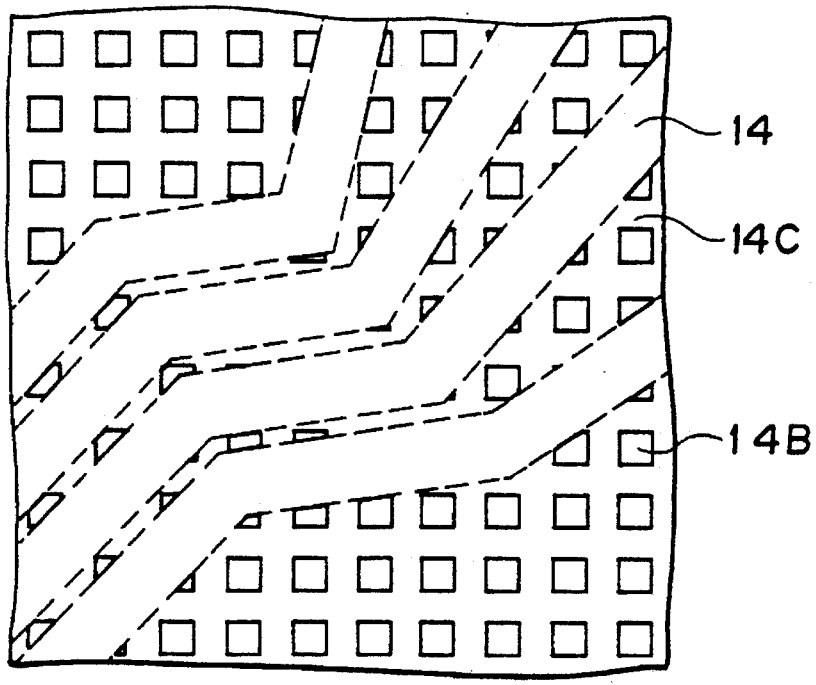

FIGS. 7A–C show the positional relation among the signal line 12, the power line or ground line 14, and the insulating layer 10. FIG. 7 (A) is a schematically drawn partial plane view showing the location of the signal line 12 (hatched) and the power line or ground line 14 (shown with broken lines), but the insulating layer 10 is omitted from the figure. FIG. 7 (B) is an exploded partial cross section view along the line B—B, and FIG. 7 (C) shows schematically the patterned power line or ground line 14 (shown with broken lines). The region 14B defined inside a square or a polygon has no power line or ground line formed therein. A part of this region 14B comprises a mesh-shaped conductor 14C formed therein, according to the preferred embodiment of the present invention.

The substrate 1B shown in FIG. 6 according to the present example can be fabricated by process steps described below.

[Step 200]

For instance, a double copper-clad glass epoxy laminate 28 for the inner layer, having a 70 μm thick copper-clad on the both surfaces thereof was prepared at first. A power line or ground line 14 and a conductor 14C were formed on both of the copper foils cladded on the double copper-clad glass epoxy laminate 28, by means of a known process for fabricating a printed circuit board to obtain a pattern shown in FIG. 7 (C). An ordinary surface treatment was applied thereafter to the surface of the patterned copper foil to improve the adhesiveness of the surface.

[Step 210]

Then, for example, two single copper-clad glass epoxy laminates 24 and 26 for use in forming thereon a signal line and each having a 18 μm thick copper foil laminated on one surface thereof, and a desired number of prepregs (corresponding to the insulator layer 10) each obtained by impregnating a glass cloth with an epoxy resin were prepared, Two single copper-clad glass epoxy laminates and the plurality of prepregs thus prepared were laminated to give an integrated laminate having the layers arranged in the order of single copper-clad glass epoxy laminate 24/prepreg (corresponding to the insulating layer 10)/double copper-clad glass epoxy laminate 28 for the inner layer/prepreg (corresponding to the insulating layer 10)/single copper-clad glass epoxy laminate 26, and the resulting laminate was subjected to hot pressing using a hot press according to an ordinary process for fabricating a multilayered printed circuit board. Thus was obtained a multilayered substrate.

[Step 220]

The resulting multilayered substrate was subjected to perforation, plating of through holes, and patterning. In this manner, a signal line 12 and a land portion and the other circuits 30 for mounting active and passive elements and the like were obtained. Furthermore, via holes or through holes, and inner layer circuit 32 were formed inside the substrate 1B for connecting the signal line 12, the circuits 30, and the power line or ground line 14. The signal line 12 and the power line or ground line 14 were patterned as shown in FIG. 7 (A). Thus was obtained the substrate 1B shown in FIG. 6. In the present example, special reference was made to a substrate having two layers of power line or ground line 14 and two layers of signal line 12, however, the number of layers can be changed as desired. Furthermore, for example, a flexible substrate comprising a copper-clad polyimide film as the substrate material can be used as well.

EXAMPLE 3

Figure 8:
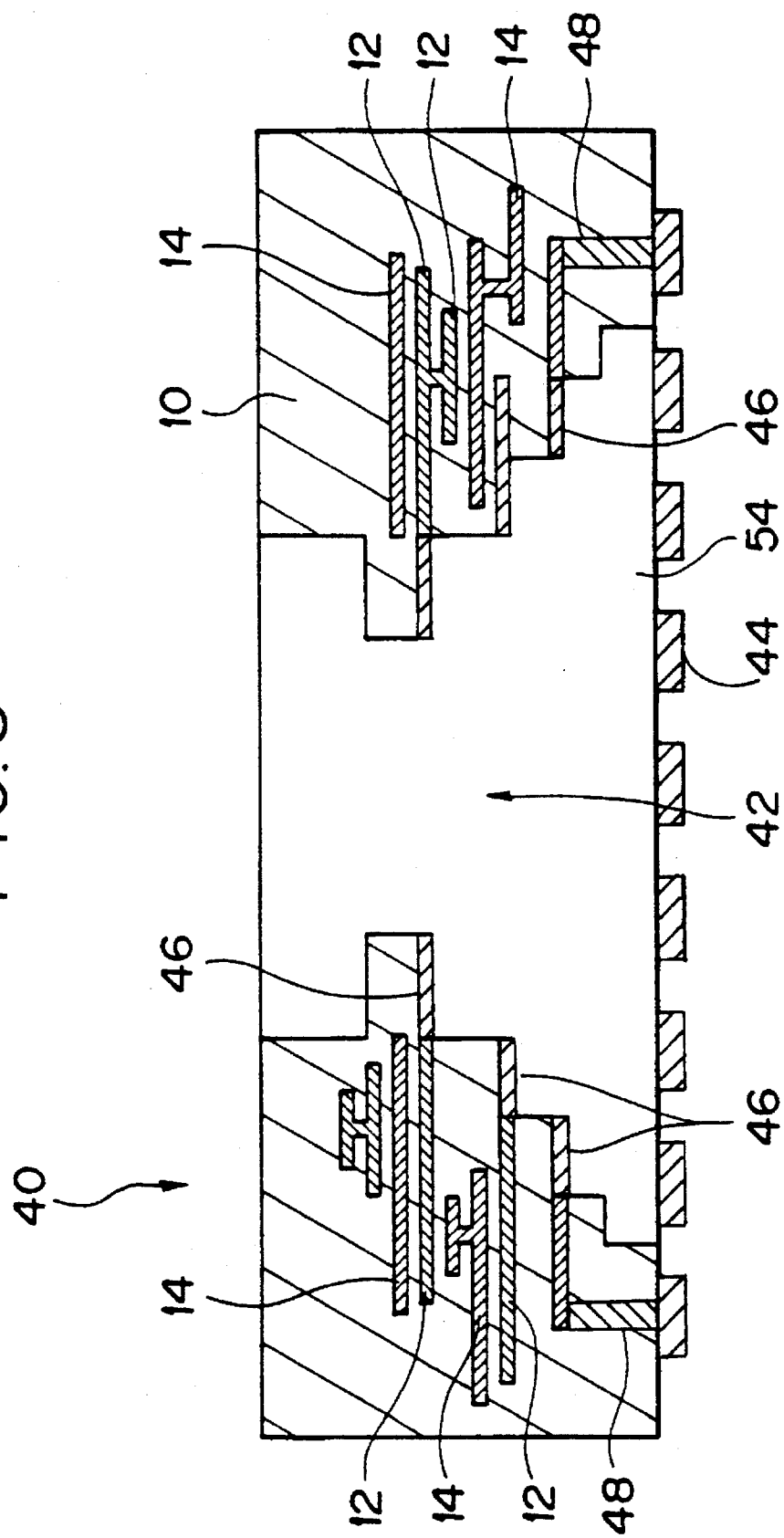
FIG. 8 is a schematic cross section view of a ceramic package according to an embodiment of the present invention (Example 3)

Referring to the schematic cross section view of FIG. 8, the present example which relates to a ceramic package according to another embodiment of the present invention is described below. The ceramic package according to the present example is a ceramic package 40 of a Land Grid Array-type, and it comprises an insulating layer 10 made of a low temperature cofired ceramic sheet, a signal line 12, and a power line or ground line 14.

The insulating layer 10 comprises a signal line on one surface thereof and a power line or ground line on the other surface thereof. In the present example, the power line or ground line 14 was provided at approximately the same pattern as that of the signal line 12, and the width of the power line or ground line 14 was set exactly the same as that of the signal line 12. The signal line 12, the power line or ground line 14, the conductor 14C, and the insulator layer 10 were arranged in the same manner as illustrated in FIGS. 2A–C.

The ceramic package 40 comprises a concave portion 42 for accommodating therein a semiconductor chip 60. The concave portion 42 in the present example penetrates the ceramic package. A land portion 44 (a synonym for "pad portion") is formed on the lower surface of the ceramic package 40, and a connection terminal 46 is formed in the concave portion 42 to use in the connection with the semiconductor chip. Furthermore, a conductor circuit 48 for electrically connecting the signal line, the power line or ground line 14, the land portion 44, and the connector terminal 46 is also formed in the concave portion 42. The conductor circuit portion 48 further includes via holes and through holes formed inside the low temperature cofired ceramic sheets. If necessary, resistor portions and capacitor portions can be formed either inside or on the surface of the ceramic package.

The ceramic package 40 is connected via the land portion to the circuit formed on the printed wiring board (not shown in the figure). More specifically, the ceramic package can be connected either electrically or mechanically to the circuit formed on the printed wiring board, or it can be connected either electrically or mechanically to a socket (not shown in the figure) which is electrically or mechanically connected to the printed circuit board. The land portion 44 comprises an array of a plurality of portions arranged along the longitudinal and the transverse directions at a pitch of, for example, 2.54 mm, on the surface of the bottom portion of the ceramic package. In the present example, the connection terminal 46 is provided as a connection terminal for wire bonding.

Referring to the schematic cross section view of FIG. 9 showing the ceramic package having therein a semiconductor chip, a semiconductor chip 60 is placed inside the concave portion 42 of the ceramic package 40, and is electrically connected to the connection terminal 46 by a gold wire. The semiconductor chip 60 is fixed by a known method to a heat sink 52 provided for radiating heat, and the heat-radiating heat sink 52 is assembled into the upper portion of the concave portion 42 of the ceramic package by a known method. A lid 54 is further attached to the lower portion of the concave portion 42 of the ceramic package by a known method.

Detailed description of the process for fabricating the ceramic package 40 according to the present embodiment is omitted, because it can be fabricated by a process which is substantially the same as that for the substrate described in Example 1.

The present invention was described above in detail referring to preferred embodiments. However, the present invention is not only limited thereto. The structures of the substrates and the ceramic package above are given only as examples, and are therefore subject to various design modifications. Similarly, the materials referred herein are also given as examples. Accordingly, alternative materials can be properly used depending on the characteristics and the like required on the substrates and the ceramic packages.

The arrangement of the signal line or the power line or ground line can be set properly according to the demands. For instance, the power line or ground line can be provided either on the upper side or on the lower side of the signal line, or on both sides of the signal line. In other words, the signal line can be provided on either the upper or the lower side of the power line or ground line, or on both sides thereof. Furthermore, the signal line and the power line or ground line can be arranged into a micro strip line structure, a suspended line structure, etc.

If necessary, a low frequency signal line can be provided to the power line or ground line. The signal line and the power line or ground line were illustrated in the figure as if they were sticking out of the surface of the insulating layer. However, they can be buried inside the surface of the insulating layer. In case of forming a mesh-like conductor, the plane structure of the conductor is not only limited to that shown in the figure, and various design modifications are acceptable.

The substrates according to the present invention includes multilayered wiring substrates for hybrid ICs and multi chip modules, comprising a silicon or a ceramic base having thereon a polyimide resin insulating layer and a signal line and a power line or ground line formed between the insulating layers.

The ceramic package according to the present invention was described in detail referring to a specific case based on a land grid array type package. However, the present invention is applicable to various types of packages as well, such as a pin grid array-type package and a quad flat package. Furthermore, the semiconductor chip can be electrically connected to the connection terminal 46 by way of, for example, employing a flip chip method. If necessary, the space defined by the concave portion, the semiconductor chip, and the lid can be filled with a thermally conductive material having excellent thermal conductivity to increase the heat-radiating effect. A thermally conductive material such as silicone oil, a composition comprising a metal oxide (e.g., ZnO) or a filler (e.g., an alumina powder and an aluminum nitride powder), and a resin composition having a powder of a metal (e.g., copper and aluminum), can be used for the purpose above.

As described in the foregoing, a substrate or a ceramic package according to the present invention comprises a signal line running on either the upper or the lower side of a power line or ground line with an insulating layer being incorporated therebetween. Accordingly, a well-controlled constant high frequency characteristics, particularly characteristic impedance, can be imparted to the signal line irrespective of the presence of a power line or ground line. Thus, the problems of a prior art technology, i.e., the generation of a fluctuation in the signal line due to the presence of the power line or ground line, can be overcome by the substrate or the ceramic package according to the present invention. Since the power line or ground line is not formed over the entire surface of the insulating layer, the substrate or the ceramic package according to the present invention can be fabricated with high dimensional stability; moreover, the generation of inter layer separation can be prevented from occurring on the substrates or the ceramic packages during the fabrication thereof.

While the invention has been described in detail and with reference to specific embodiments thereof, it will be apparent to one skilled in the art that various changes and modifications can be made therein without departing from the spirit and scope thereof.

What is claimed is:

1. A substrate comprising an insulating layer having a signal line on a first surface of said insulating layer and a conductive line on a second surface of said insulating layer, a position of the conductive line on the second surface of the insulating layer corresponding to a position of the signal line on the first surface of the insulating layer.

2. The substrate of claim 1, wherein, a mesh-like conductor is connected to the conductive line and is formed on the second surface of the insulating layer in an area of the second surface which does not contain the conductive line.

3. The substrate of claim 1, wherein, a width of the conductive line is from one to two times as wide as a width of the signal line.

4. The substrate of claim 2, wherein, a width of conductive line is from one to two times as wide as a width of the signal line.

5. The substrate of claim 2, wherein, the insulating layer comprises a laminate comprised of a plurality of low temperature cofired ceramic sheets.

6. The substrate of claim 4, wherein, the insulating layer comprises a laminate comprised of a plurality of low temperature cofired ceramic sheets.

7. The substrate of claim 4, wherein, the insulating layer comprises a laminate comprised of a plurality of layers of a polymer material.

8. A substrate comprising an insulating layer having a signal line on a first surface of the insulating layer and a conductive line on a second surface of the insulating layer, a position of the conductive line on the second surface corresponding to a position of the signal line on the first surface of the insulating layer, the second surface of said insulating layer having a mesh-like conductor connected to the conductive line and located in an area of the second surface which does not contain the conductive line, the insulating layer comprising a laminate comprised of a plurality of low temperature cofired ceramic sheets, and the conductive line having a width from one to two times as wide as a width of the signal line.

9. A ceramic package for packaging semiconductor chips comprised of: an insulating layer further comprised of low temperature cofired ceramic sheets, a signal line formed on a first surface of the insulating layer and a conductive line formed on a second surface of said insulating layer, a position of the conductive line on the second surface corresponding to a position of the signal line of the first surface of the insulating layer.

10. The ceramic package of claim 9, further comprising: a mesh-like conductor connected to the conductive line and formed on the second surface of the insulating layer and located in an area of the second surface which does not contain the conductive line.

11. The ceramic package of claim 9, wherein, a width of the conductive line is from one to two times as wide as a width of the signal line.

12. The ceramic package of claim 9, wherein, a width of the conductive line is more than two times as wide as a width of the signal line.

13. A ceramic package for packaging semiconductor chips comprised of: an insulating layer further comprised of low temperature cofired ceramic sheets, a signal line formed on a first surface of the insulating layer and a conductive line formed on a second surface of said insulating layer, a position of the conductive line on the second surface corresponding to a position of the signal line on the first surface of the insulating layer, the second surface of the insulating layer having a mesh-like conductor connected to the conductive line and located in an area of the second surface which does not contain the conductive line, and wherein the conductive line has a width of from one to two times as wide as a width of the signal line.

\* \* \* \* \*